(12) United States Patent
Yoon et al.

(10) Patent No.: US 11,963,392 B2
(45) Date of Patent: Apr. 16, 2024

(54) ORGANIC LIGHT EMITTING DIODE DISPLAY DEVICE

(71) Applicant: LG DISPLAY CO., LTD., Seoul (KR)

(72) Inventors: A-Ra Yoon, Paju-si (KR); Hoon Kang, Paju-si (KR); Byung-Joo Lee, Paju-si (KR); Keong-Jin Lee, Paju-si (KR); Jun-Young Kwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 305 days.

(21) Appl. No.: 17/408,069

(22) Filed: Aug. 20, 2021

(65) Prior Publication Data

US 2022/0199957 A1 Jun. 23, 2022

(30) Foreign Application Priority Data

Dec. 23, 2020 (KR) .................. 10-2020-0181979

(51) Int. Cl.
*H01L 21/00* (2006.01)
*H10K 50/84* (2023.01)
*H10K 50/858* (2023.01)
*H10K 59/131* (2023.01)

(52) U.S. Cl.
CPC ......... *H10K 50/858* (2023.02); *H10K 50/841* (2023.02); *H10K 59/131* (2023.02)

(58) Field of Classification Search
CPC .................................................. H10K 50/858
See application file for complete search history.

(56) References Cited

U.S. PATENT DOCUMENTS

2021/0202917 A1* 7/2021 Lee .................... H10K 50/844

FOREIGN PATENT DOCUMENTS

| KR | 10-2018-0133706 A | 12/2018 |
| KR | 10-2019-0047554 A | 5/2019 |
| KR | 10-2019-0048785 A | 5/2019 |
| KR | 10-2019-0086605 A | 7/2019 |
| KR | 110-2019-0078955 A | 7/2019 |

OTHER PUBLICATIONS

Korean Office Action dated Feb. 28, 2024 issued in Patent Application No. 10-2020-0181979 (6 pages).

* cited by examiner

*Primary Examiner* — Douglas M Menz
(74) *Attorney, Agent, or Firm* — POLSINELLI PC

(57) ABSTRACT

An organic light emitting diode display device includes a substrate having an active area and a non-active area, a light emitting diode in the active area, a sealing layer over the light emitting diode, at least one lens pattern over the sealing layer, the at least one lens pattern having a convex shape, and a passivation layer in the active area and the non-active area, the passivation layer covering the at least one lens pattern and having a first open portion exposing a first pad area.

20 Claims, 6 Drawing Sheets

ORGANIC LIGHT EMITTING DIODE DISPLAY DEVICE

CROSS-REFERENCE TO RELATED APPLICATION

The present application claims the priority benefit of Korean Patent Application No. 10-2020-0181979 filed on Dec. 23, 2020, which is hereby incorporated by reference in its entirety.

BACKGROUND

Field of the Disclosure

The present disclosure relates to an organic light emitting diode display device, and more particularly, to an organic light emitting diode display device where a light extraction efficiency is improved.

Description of the Background

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since the inner elements of the OLED display device have a solid phase, the OLED display device has high durability against an external impact and has a wide available temperature range.

Specifically, since the OLED display device is fabricated using an organic thin film, the OLED display device may be optimally applied to a flexible display device due to flexibility and elasticity of the organic thin film.

In the OLED display device, for cost reduction and structural convenience of a driving integrated circuit (IC), the driving IC mounted on a flexible film through a chip on film (COF) type or a chip on plastic (COP) type is attached to a pad in a non-display area of a display panel using an anisotropic conductive film such that a plurality of driving ICs are connected to a plurality of pads.

To expose the pad on the display panel, a delamination process of removing a portion of a passivation layer on the display panel may be performed. However, since the passivation layer includes various layers for improving a luminance, it is difficult to remove a portion of the passivation layer.

SUMMARY

Accordingly, the present disclosure is directed to an organic light emitting diode display device that substantially obviates one or more of the problems due to limitations and disadvantages of the background art.

Also, the present disclosure is to provide an organic light emitting diode display device where a luminance efficiency is improved.

In addition, the present disclosure is to provide an organic light emitting diode display device where a delamination process of a passivation layer for exposing a pad is omitted.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes: a substrate having an active area and a non-active area; a light emitting diode in the active area; a sealing layer over the light emitting diode; at least one lens pattern over the sealing layer, the at least one lens pattern having a convex shape; and a passivation layer in the active area and the non-active area, the passivation layer covering the at least one lens pattern and having a first open portion exposing a first pad area.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
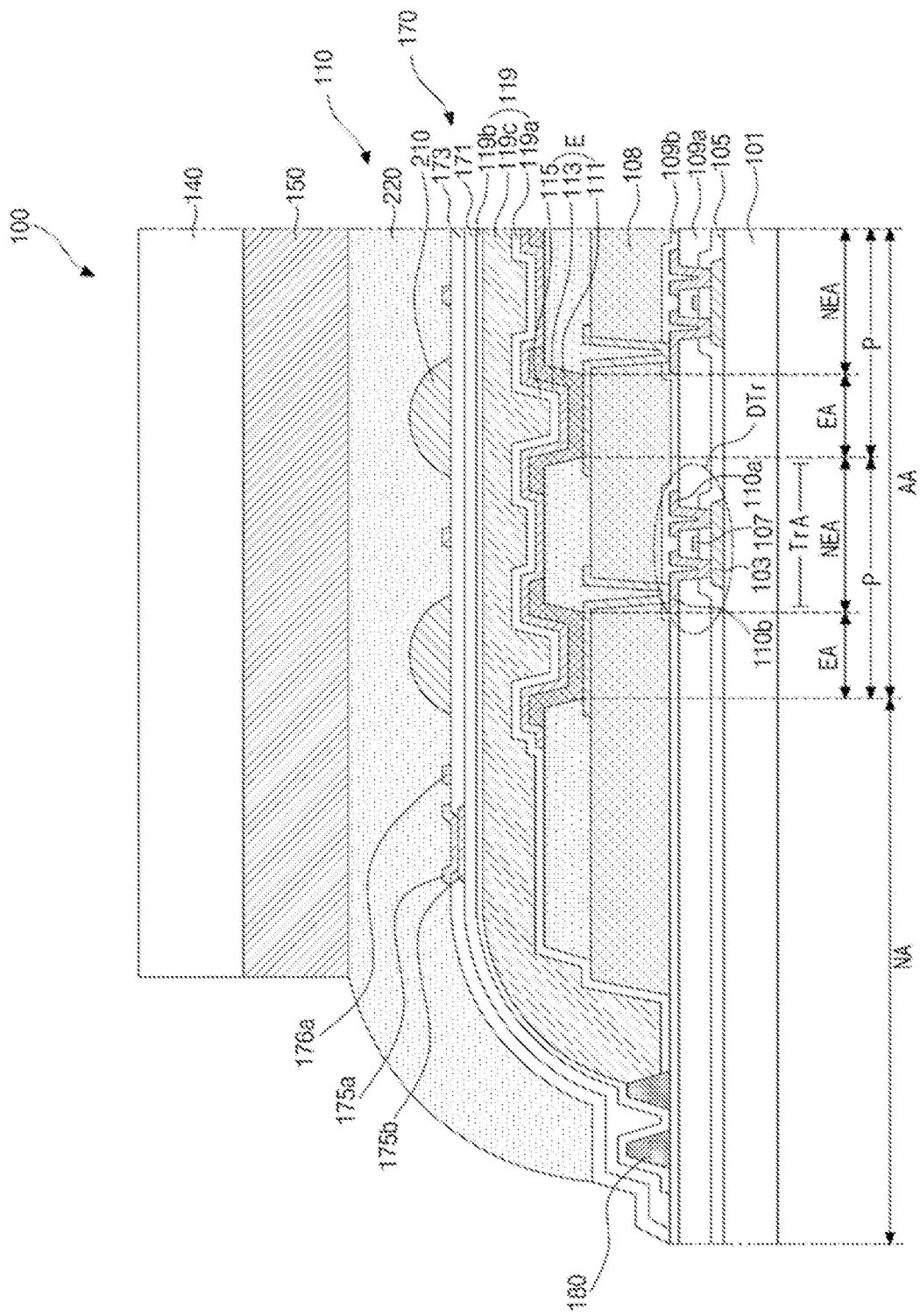
FIG. 1 is a cross-sectional view showing an organic light emitting diode display device according to a first aspect of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Reference will now be made in detail to the present disclosure, examples of which are illustrated in the accompanying drawings.

Figure 2:
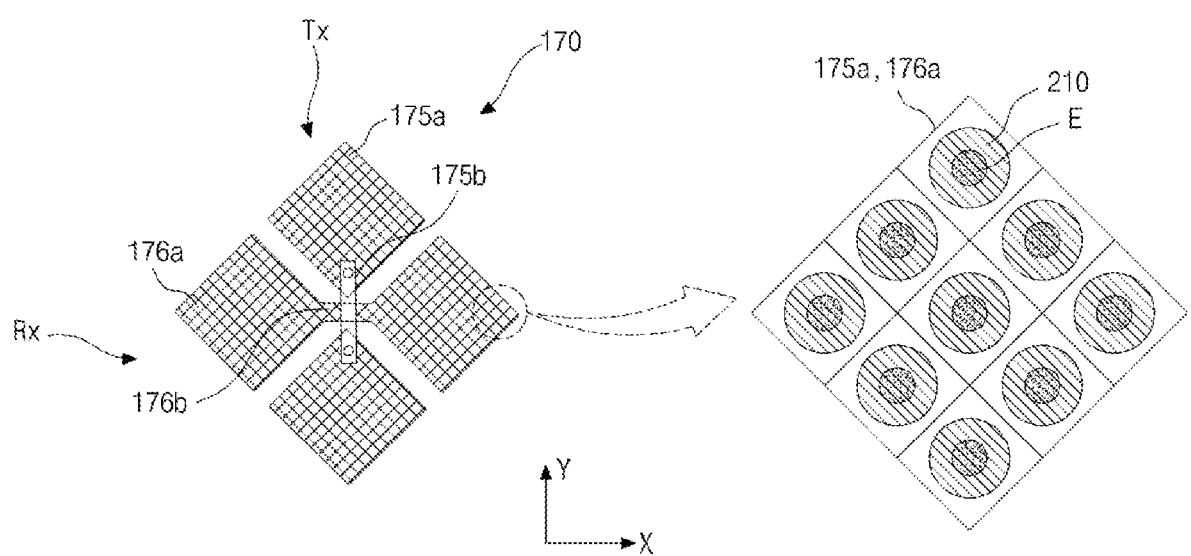
FIG. 2 is a plan view showing a touch pattern of an organic light emitting diode display device according to a first aspect of the present disclosure.

FIG. 1 is a cross-sectional view showing an organic light emitting diode display device according to a first aspect of the present disclosure, and FIG. 2 is a plan view showing a touch pattern of an organic light emitting diode display device according to a first aspect of the present disclosure.

An organic light emitting diode (OLED) display device according to a first aspect of the present disclosure is classified into a top emission type and a bottom emission type according to an emission direction of a light. In a first aspect of the present disclosure, a top emission type OLED display device will be exemplarily illustrated.

In FIGS. 1 and 2, an organic light emitting diode (OLED) display device 100 according to a first aspect of the present disclosure includes a display panel 110 for displaying an image and a cover window 140 for protecting the display panel 110. A touch pattern 170 is disposed between the cover window 140 and the display panel 110.

The display panel 110 includes an organic light emitting diode (OLED) panel, and the OLED panel includes a substrate 101 having a driving thin film transistor (TFT) DTr and a light emitting diode E and a sealing layer 119 encapsulating the substrate 101.

An active area AA and a non-active area NA may be defined in the substrate 101, and the non-active area NA may be disposed at a side of the active area AA.

The active area AA includes a pixel region P to display an image, and the non-active area NA includes various circuits and various conductive lines for driving the pixel region P.

The active area AA includes an emission area EA where the light emitting diode E of the pixel region P is disposed to substantially display an image and a non-emission area NA including a switching area TrA where the driving TFT DTr is disposed. The non-emission area NA is disposed along a boundary of the emission area EA.

A semiconductor layer 103 is disposed in the switching area TrA on the substrate 101. The semiconductor layer 103 may be formed of silicon. The semiconductor layer 103 may include an active region of a channel at a center portion thereof and source and drain regions at side portions of the active region. The silicon of the source and drain regions may be doped with impurities of high concentration.

A gate insulating layer 105 is disposed on the semiconductor layer 103. The gate insulating layer 105 may include an inorganic material layer of an inorganic material such as silicon oxide (SiOx) and silicon nitride (SiNx) or a multiple layer of an inorganic material.

A gate electrode 107 is disposed on the gate insulating layer 105 over the active region of the semiconductor layer 103. Although not shown, a gate line is disposed along one direction on the gate insulating layer 105.

A first interlayer insulating layer 109a is disposed on the gate electrode 107 and the gate line. The first interlayer insulating layer 109a and the gate insulating layer 105 have semiconductor contact holes exposing the source and drain regions at sides of the active region.

Source and drain electrodes 110a and 110b spaced apart from each other are disposed on the first interlayer insulating layer 109a. The source and drain electrodes 110a and 110b are connected to the source and drain regions, respectively, through the semiconductor contact holes.

A second interlayer insulating layer 109b is disposed on the source and drain electrodes 110a and 110b and the first interlayer insulating layer 109a between the source and drain electrodes 110a and 110b.

The source and drain electrodes 110a and 110b, the semiconductor layer 103 having the source and drain regions contacting the source and drain electrodes 110a and 110b, the gate insulating layer 105 on the semiconductor layer 103 and the gate electrode 107 constitute the driving TFT DTr.

Although not shown, a data line crossing the gate line to define the pixel region P is disposed on the first interlayer insulating layer 109a, and a switching TFT having the same structure as the driving TFT DTr is connected to the driving TFT DTr.

The switching TFT and the driving TFT DTr has a top gate type where the semiconductor layer 103 includes polycrystalline silicon or an oxide semiconductor material in a first aspect. The switching TFT and the driving TFT DTr may have a bottom gate type where the semiconductor layer 103 includes intrinsic amorphous silicon and impurity-doped amorphous silicon in another aspect.

When the semiconductor layer 103 includes an oxide semiconductor material, a light shielding layer (not shown) may be disposed under the semiconductor layer 103 and a buffer layer (not shown) may be disposed between the light shielding layer and the semiconductor layer.

A planarizing layer 108 planarizing a step difference caused by the driving TFT DTr may be disposed on the second interlayer insulating layer 109b. The planarizing layer 108 may include an organic material such as acrylic resin, epoxy resin, phenolic resin, polyamide resin and polyimide resin.

The first interlayer insulating layer 109a, the second interlayer insulating layer 109b and the planarizing layer 108 have a drain contact hole exposing the drain electrode 110b.

A first electrode 111 is disposed on the planarizing layer 108 and is connected to the drain electrode 110b of the driving TFT DTr through the drain contact hole. For example, the first electrode 111 may be an anode of the light emitting diode E and may include a material having a relatively high work function.

The first electrode 111 may include a metallic material having a relatively high reflectance such as aluminum (Al) and silver palladium copper (AgPdCu: APC) alloy. For example, the first electrode 111 may have a triple layer of one of titanium, aluminum and titanium (Ti/Al/Ti), indium tin oxide, aluminum and indium tin oxide (ITO/Al/ITO) and indium tin oxide, APC alloy and indium tin oxide (ITO/APC/ITO).

The first electrode 111 is disposed in each pixel region P, and a bank 116 is disposed between the first electrodes 111 of adjacent pixel regions P. The first electrode 111 is divided in each pixel region P with the bank 116 as a border between pixel regions P.

A light emitting layer 113 is disposed on the first electrode 111. The light emitting layer 113 may have a single layer of an emitting material. Alternatively, the light emitting layer 113 may have a multiple layer of a hole injecting layer, a hole transporting layer, an emitting material layer, an electron transporting layer and an electron injecting layer for increasing an emission efficiency.

A second electrode 115 is disposed on the light emitting layer 113. The second electrode 115 may be a cathode of a light emitting diode E and may be formed on an entire surface of the substrate 101.

The light emitting layer 112 may be a common layer of a white emitting layer emitting a white colored light and commonly formed in the pixel regions P. Alternatively, the light emitting layer 112 may be divided into the pixel regions P to include different materials. When the light emitting layer 112 is divided into pixel regions P, the light emitting layer 113 may have different thicknesses in the pixel regions P.

The second electrode 115 may include a material having a relatively low work function. For example, the second electrode 115 may include a transparent conductive material such as indium tin oxide (ITO) and indium zinc oxide (IZO) or a transflective conductive material such as magnesium (Mg), silver (Ag) and magnesium silver alloy.

When the second electrode 115 includes a transflective conductive material, a light extraction efficiency may increase due to a micro cavity.

When a voltage is applied to the first and second electrodes 111 and 115 according to a selected signal, a hole injected from the first electrode 111 and an electron injected from the second electrode 115 are transported to the light emitting layer 113 to constitute an exciton. When the exciton transitions from an excited state to a ground state, a light is generated and emitted to an exterior.

The light of the light emitting layer 113 passes through the transparent second electrode 115 to be emitted to an exterior such that the OLED display device 100 displays an image.

The sealing layer 119 of a thin film is disposed on the driving TFT DTr and the light emitting diode E, and the OED display device 100 is encapsulated with the sealing layer 119.

The sealing layer 119 covers the active area AA and extends to the non-active area NA.

To prevent an external oxygen and an external moisture from penetrating into an interior, the sealing layer 119 includes at least two inorganic sealing layers 119a and 119b. An organic sealing layer 119c may be interposed between the at least two inorganic sealing layers 119a and 119b to remedy an impact resistance of the at least two inorganic sealing layers 119a and 119b.

In a structure where the organic sealing layers 119c and the inorganic sealing layers 119a and 119b are alternately repeated, the inorganic sealing layers 119a and 119b may be formed to completely wrap the organic sealing layers 119c for preventing penetration of an external oxygen and an external moisture through a side surface of the organic sealing layers 119c.

The at least inorganic sealing layers 119a and 119b may include one of silicon nitride, aluminum nitride, zirconium nitride, titanium nitride, hafnium nitride, tantalum nitride, silicon oxide, aluminum oxide and titanium oxide.

The organic sealing layer 119c may one of include acrylic resin and epoxy resin.

As a result, in the OLED display device 100, penetration of an external oxygen and an external moisture into an interior is prevented.

In addition, oxidation and corrosion of the electrodes due to the oxygen and the moisture is prevented, and reduction in emission property and in lifetime of the light emitting layer 113 is prevented.

Further, a current leakage and an electric shortage are prevented and deterioration of the pixel region P is prevented. Moreover, non-uniformity of a luminance and a display quality is prevented.

A protecting dam 180 is disposed outside the sealing layer 119 to completely surround the active area AA. The organic sealing layer 119c of the sealing layer 119 for protecting elements of the OLED display device 100 from external particles (oxygen and moisture) is stably confined inside the protecting dam 180.

The protecting dam 180 may include a same layer and a same material as the second interlayer insulating layer 109b and the bank 116.

The touch pattern 170 is disposed on the sealing layer 119. The touch pattern 170 includes a plurality of touch transmitting lines Tx along a y-axis and a plurality of touch receiving lines Rx along an x-axis in the active area AA. The plurality of touch transmitting lines Tx and the plurality of touch receiving lines Rx do not contact each other and cross each other.

A touch buffer layer 171 is disposed on the sealing layer 119, and a touch insulating layer 173 is disposed on the touch buffer layer 171. The plurality of touch transmitting lines Tx and the plurality of touch receiving lines Rs are disposed on the touch insulating layer 173 to cross each other.

The plurality of touch transmitting lines Tx include a plurality of first touch electrodes 175a and a plurality of first touch bridges 175b electrically connecting the plurality of first touch electrodes 175a.

The plurality of first touch electrodes 175a are disposed on the touch insulating layer 173 and are spaced apart from each other along the y-axis. The plurality of first touch electrodes 175a are electrically connected to each other through the plurality of first bridges 175b.

The plurality of first bridges 175b are disposed on the touch buffer layer 171 and are exposed through touch contact holes in the touch insulating layer 173. The plurality of touch electrodes 175a are connected to the plurality of first bridges 175b through the touch contact holes.

The plurality of touch receiving lines Rx include a plurality of second touch electrodes 176a and a plurality of second bridges 176b electrically connecting the plurality of second touch electrodes 176a.

The plurality of second touch electrodes 176a are disposed on the touch insulating layer 173 and are spaced apart from each other along the x-axis. The plurality of second touch electrodes 176a are electrically connected to each other through the plurality of second bridges 176b.

The plurality of second bridges 176b have the same layer as the plurality of second electrodes 176a and electrically contact the plurality of second electrodes 176a without an additional contact hole.

The plurality of first bridges 175b and the plurality of second bridges 176b may be disposed to overlap each the bank 116 to prevent reduction of an aperture ratio due to the plurality of first bridges 175b and the plurality of second bridges 176b.

The plurality of touch transmitting lines Tx and the plurality of touch receiving lines Rx cross each other to constitute a mutual capacitance Cm at crossing of the plurality of touch transmitting lines Tx and the plurality of touch receiving lines Rx. The mutual capacitance Cm is charged by a touch driving pulse supplied to the plurality of touch transmitting lines Tx and is discharged to the plurality of touch receiving lines Rx to function as a touch sensor.

The plurality of touch transmitting lines Tx and the plurality of touch receiving lines Rx are electrically connected to a flexible film 190 (of FIG. 5) through a routing line 177 in the non-active area NA outside the active area AA, and the flexible film 190 is connected to a touch driving part (not shown).

The routing line 177 may have the same layer and the same material as the plurality of first touch electrodes 175a and the plurality of second touch electrodes 176a. In addition, the routing line 177 is disposed on a slanting surface of the sealing layer 119.

In the OLED display device 100 according to a first aspect of the present disclosure, at least one lens pattern 210 is further disposed on the touch insulating layer 173. The at least one lens pattern 210 is disposed inside the touch pattern 170.

For example, the plurality of first touch electrodes 175a and the plurality of second touch electrodes 176a have a mesh shape having an opening, and the light emitting diode E may be disposed to correspond to the opening of the plurality of first touch electrodes 175a and the plurality of second touch electrodes 176a. As a result, a light extraction efficiency is improved.

The at least one lens pattern 210 is disposed to correspond to the emission area EA of the light emitting diode E. For example, the emission area EA of the light emitting diode E may be disposed to correspond to the at least one lens pattern 210. Although one lens pattern 210 corresponds to the emission area EA of one light emitting diode E in a first aspect, a plurality of lens patterns 210 may correspond to the emission area EA of one light emitting diode E in another aspect.

Since the at least one lens pattern 210 corresponding to the emission area EA of the light emitting diode E is disposed on the sealing layer 119, the light emitting diode E and the at least one lens pattern 210 are spaced apart from each other by a predetermined distance. As a result, the a focal length for improving a collection efficiency and an emission efficiency of a light emitted from the light emitting diode E is obtained to improve a luminance efficiency.

The at least one lens pattern 210 may be disposed not to overlap the plurality of first touch electrodes 175a and the plurality of second touch electrodes 176a. The at least one lens pattern 210 may be disposed to correspond to the opening of the plurality of first touch electrodes 175a and the plurality of second touch electrodes 176a. Among a light emitted from the light emitting diode E, a light having an angle greater than a critical angle with respect to a normal line of the substrate 101 may be totally reflected by an interface surface of various layers. The totally reflected light may not be emitted to an exterior and may be reflected to an interior to be dissipated.

As a result, the totally reflected light does not contribute to an emission and a region where the totally reflected light passes become a dead zone.

Since the mesh shape of the plurality of first touch electrodes 175a and the plurality of second touch electrodes 176a is disposed to correspond to the dead zone, the light emitted from the light emitting diode E is not obstructed by the plurality of first touch electrodes 175a and the plurality of second touch electrodes 176a.

The at least one lens pattern 210 is disposed to cover the emission area EA of the light emitting diode E. When a size of the at least one lens pattern 210 is smaller than a size of the emission area EA, the light passing through the at least one lens pattern 210 decreases, and a light collection efficiency and a light emission efficiency are reduced.

When a size of the at least one lens pattern 210 is greater than a size of the emission area EA, a radius of curvature of the at least one lens pattern 210 increases, and a power of the at least one lens pattern 210 decreases. As a result, a light collection efficiency is reduced.

Accordingly, the at least one lens pattern 210 may have a size such that a power increases due to a relatively short radius of curvature and a light collection efficiency is maximized due to most of a light emitted from the emission area EA passing through the at least one lens 210. The at least one lens pattern 210 may be disposed not to overlap the dead zone. As a result, since the at least one lens pattern 210 is disposed not to overlap the plurality of first touch electrodes 175a and the plurality of second touch electrodes 176a, a power is maximized and a light collection efficiency is maximized.

Although the at least one lens pattern 210 may include a photoacryl for a low temperature process performable at a temperature less than or equal to 100 degree, it is not limited thereto. For example, the at least one lens pattern 210 may include polytriazine or polaytriazine having at least one of titanium oxide ($TiO_2$)), zirconium oxide ($ZrO_2$)) and nano filler.

The at least one lens pattern 210 may be formed to have a convex shape using an exposure process.

When the at least one lens pattern 210 is formed through a high temperature process, the light emitting diode E under the at least one lens pattern 210 may be deteriorated by a high temperature. As a result, deterioration of the light emitting diode E during a process of forming the at least one lens pattern 210 may be minimized by forming the at least one lens pattern 210 with a material for a low temperature process through a low temperature.

Since an exposure process for a convex shape of the at least one lens pattern 210 is performed using a photomask of an exposure process for the planarizing layer 108 or the bank 116, an additional photomask for a convex shape of the at least one lens pattern 210.

A process of forming the at least one lens layer 210 will be illustrated hereinafter. A lens layer is coated over the sealing layer 119 to cover the touch insulating layer 173. The lens layer may include polytriazine or polaytriazine having at least one of titanium oxide ($TiO_2$)), zirconium oxide ($ZrO_2$)) and nano filler for a low temperature process.

An edge bead removal process of removing an edge portion of the lens layer is performed, and a pre-baking process of removing a solvent of the lens layer is performed.

An exposure process of irradiating a light onto the lens layer through a photomask is performed such that lens layer has a light reaction.

A developing process, a rinse process, a post-baking process and a curing process are performed to form the at least one lens pattern 210.

A passivation layer 220 is formed on the at least one lens pattern 210 to cover the at least one lens pattern 210.

The passivation layer 220 protects the at least one lens pattern 210 and prevents corrosion of the touch transmitting line Tx and the touch receiving line Rx of the touch pattern 170 due to a moisture and an oxygen.

Since the passivation layer 220 is formed to have a refractive index smaller than a refractive index of the at least one lens pattern 210, a light collection efficiency and a light emission efficiency increase due to a refractive index difference at an interface of the at least one lens pattern 210 and the passivation layer 220.

For example, the at least one lens pattern 210 may have a refractive index of about 1.5 to about 1.8, and the passivation layer 220 may have a refractive index of about 1.3 to about 1.55. The refractive index of the passivation layer 220 may be smaller than the refractive index of the at least one lens pattern 210. As a difference between the refractive indexes of the passivation layer 220 and the at least one lens pattern 210 is greater, a light collection efficiency and a light emission efficiency further increase.

A polarizing plate 150 for preventing reduction of a contrast ratio due to an external light is disposed on the passivation layer 220. Since the polarizing plate 150 is disposed in a path of a light emitted from the light emitting layer 113 in a driving mode, an external light incident to the OLED display device 100 is blocked by the polarizing plate 150 and a contrast ratio is improved.

A cover window 140 for protecting the display panel 110 is disposed on the polarizing plate 150.

The cover window 140 protects the display panel 110 from an external impact and transmits a light emitted from the display panel 110 such that an image of the display panel 110 is shown to an exterior.

The cover window 140 may include a material having an impact resistance and a light transmittance such as poly methyl methacrylate (PMMA), polycarbonate (PC), cyclo olefin polymer (COP), polyethylene terephthalate (PET), polyimide (PI) and polyamide (PA).

In the OLED display device 100 according to a first aspect of the present disclosure, since the at least one lens pattern 210 is disposed over the sealing layer 119, a light collection efficiency and a light emission efficiency of the light emitting diode E are improved.

In addition, a light extraction efficiency is improved, and the OLED display device 100 having an improved luminance efficiency is obtained.

In the OLED display device 100 according to a first aspect of the present disclosure, the passivation layer 220 extends from the active area AA to the non-active area NA to protect the at least one lens pattern 210 and to prevent a corrosion of the touch transmitting line Tx and the touch receiving line Rx of the touch pattern 170 due to a moisture and an oxygen.

The passivation layer 220 has a first pad open portion 310 (of FIG. 3) exposing a first pad area PAD-1.

As a result, a delamination process of exposing a pad is omitted, and reduction of a fabrication yield due to the delamination process is prevented.

Figure 3:
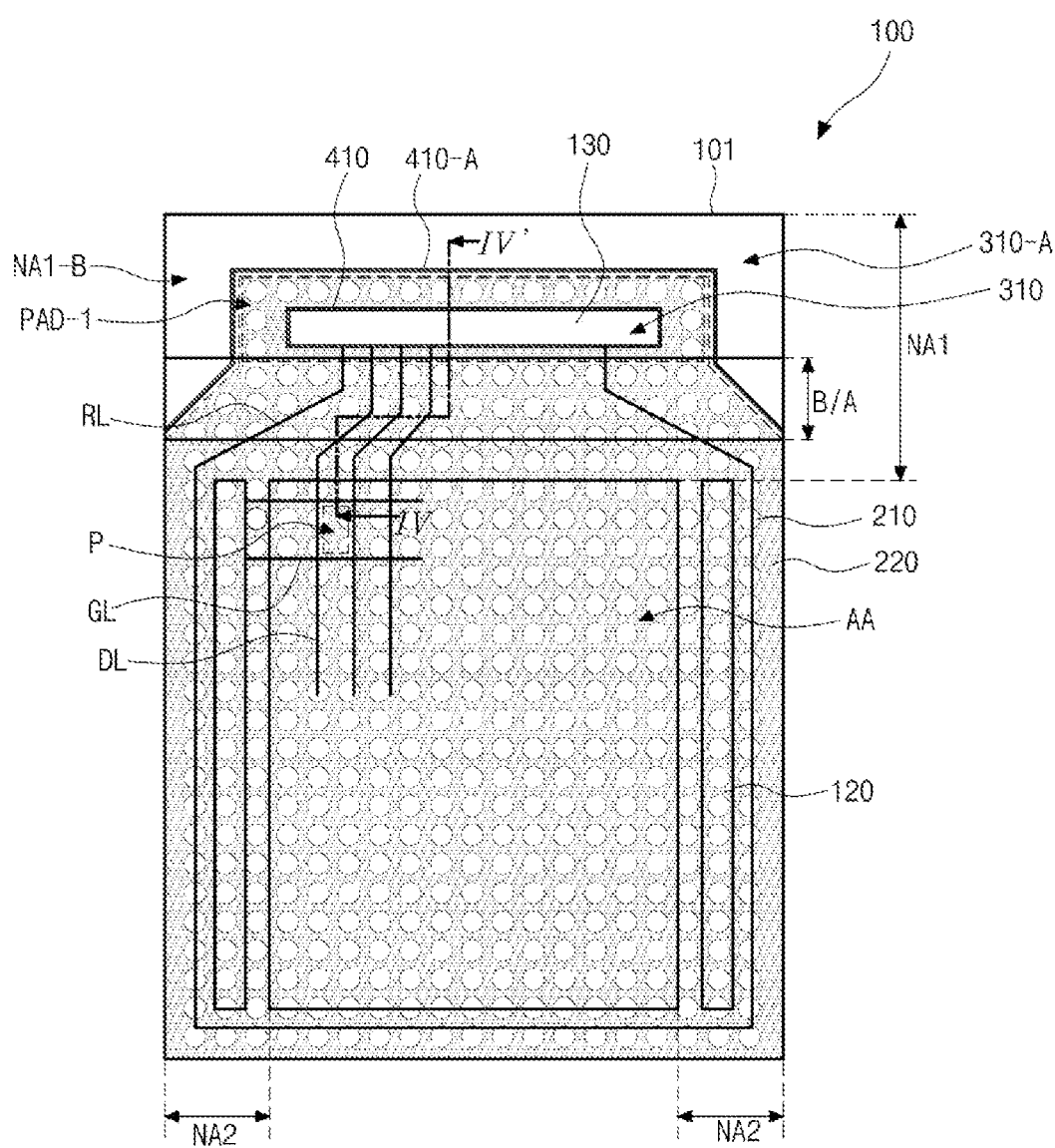
FIG. 3 is a plan view showing an organic light emitting diode display device according to a first aspect of the present disclosure.

FIG. 3 is a plan view showing an organic light emitting diode display device according to a first aspect of the present disclosure.

In FIG. 3, the active area AA and the non-active area NA (of FIG. 1) having first and second non-active areas NA1 and NA2 are defined in the transparent substrate 101 of the OLED display device 100. The active area AA is disposed in a center portion of the substrate 101, and the first and second non-active areas NA1 and NA2 is disposed along a boundary of the active area AA. The light emitting diode E (of FIG. 1) is disposed in the active area AA, and an image is displayed substantially in the active area AA. The active area AA may be referred to as a display area, and the first and second non-active areas NA1 and NA2 may be referred to as a non-display area.

A plurality of gate lines GL and a plurality of data lines DL are disposed in the active area AA. The plurality of gate lines GL and the plurality of data lines DL cross each other to define the plurality of pixel regions P. The light emitting diode E (of FIG. 1) and the driving TFT DTr (of FIG. 1) connected to each other are disposed in each pixel region P. The driving TFT DTr operates with reference to driving parts 120 and 130 in the first and second non-active areas NA1 and NA2 and adjusts a driving current supplied to the light emitting diode E.

The first non-active area NA1 is disposed at an upper portion of the active area AA and has a data driving part 130. The second non-active area NA2 is disposed at right and left portions of the active area AA and has a gate driving part 120.

The gate driving part 120 is disposed in the second non-active area NA2 and supplies a gate signal to a switching TFT of each pixel region P.

The gate driving part 120 may be formed simultaneously with elements in the active area AA. Although the gate driving part 120 is disposed in each of the right and left portions of the active area AA in the first aspect, the gate driving part 120 may be disposed in one of the right and left portions of the active area AA in another aspect.

The data driving part 130 is disposed in the first non-active area NA1 and supplies a data signal to the driving TFT DTr of each pixel region P. The data driving part 130 may be directly mounted on the substrate 101 as an integrated circuit (IC).

A first pad area PAD-1 for electric connection with the data driving part 130 is disposed in the first non-active area NA1.

A plurality of connection lines RL connecting the first pad area PAD-1 and the active area AA are disposed in the first non-active area NA1 on the substrate 101. The plurality of connection lines RL transmit various electric signals from the first pad area PAD-1 to the driving TFT DTr in the active area AA.

To minimize a bezel, the first non-active area NA1 having the first pad area PAD-1 is bent to be disposed under the active area AA. As a result, when the OLED display device 100 is viewed at front thereof, the active area AA and the second non-active area NA2 are recognized, and the first non-active area NA1 is not recognized.

A bending area B/A may be defined between the active area AA and the first pad area PAD-1.

The first non-active area NA1 includes the first pad area PAD-1 having the data driving part 130, the bending area B/A having the plurality of connection lines RL connecting the first pad area PAD-1 and the active area AA and a boundary area NA1-B between an end portion of the first non-active area NA1 and the first pad area PAD-1.

Although an identification such as a panel number is disposed in the boundary area NA1-B of the first non-active area NA1, additional lines are not disposed in the boundary area NA1-B of the first non-active area NA1.

The passivation layer 220 on a whole of the substrate 101 includes the first pad open portion 310 exposing a plurality of first pads 131 (of FIG. 4) for the data driving part 130 in the first pad area PAD-1 and a boundary open portion 310-A exposing the boundary area NA1-B of the first non-active area NA1.

As a result, a delamination process for exposing the plurality of first pads 131 in the first pad area PAD-1 is omitted, and reduction of a fabrication yield due to the delamination process is prevented.

The passivation layer 220 may be referred to as a particle capping layer and may include epoxy resin or acrylic resin where a hydroxy group (—OH) or fluorine group (—F) is added to a substituent group thereof, or epoxy resin or acrylic resin where nano hollow silica is added thereto.

The passivation layer 220 has a relatively high adhesion and is formed on a whole of the substrate 101 having the active area AA and the non-active area NA for protecting the at least one lens pattern 210 and the touch pattern 170.

To expose the plurality of first pads 131 in the first pad area PAD-1, a delamination process of the passivation layer 220 is required. However, since the passivation layer 220 has a relatively high adhesion, it is very difficult to remove a portion of the passivation layer 220 corresponding to the plurality of first pads 131.

In the OLED display device 100 according to a first aspect of the present disclosure, since the passivation layer 220 is formed to have the pad open portion 310 exposing each first pad 131 in the first pad area PAD-1, an additional delamination process is omitted.

As a result, reduction of a fabrication yield due to the delamination process is prevented.

In addition, since the passivation layer 220 is formed to have a boundary open portion 310-A exposing the boundary area NA1-B, a material cost for the passivation layer 220 is reduced.

A first dam 410 surrounding the first pad area PAD-1 and a boundary dam 410-A surrounding the boundary area NA1-B are disposed on the substrate 101.

Figure 4:
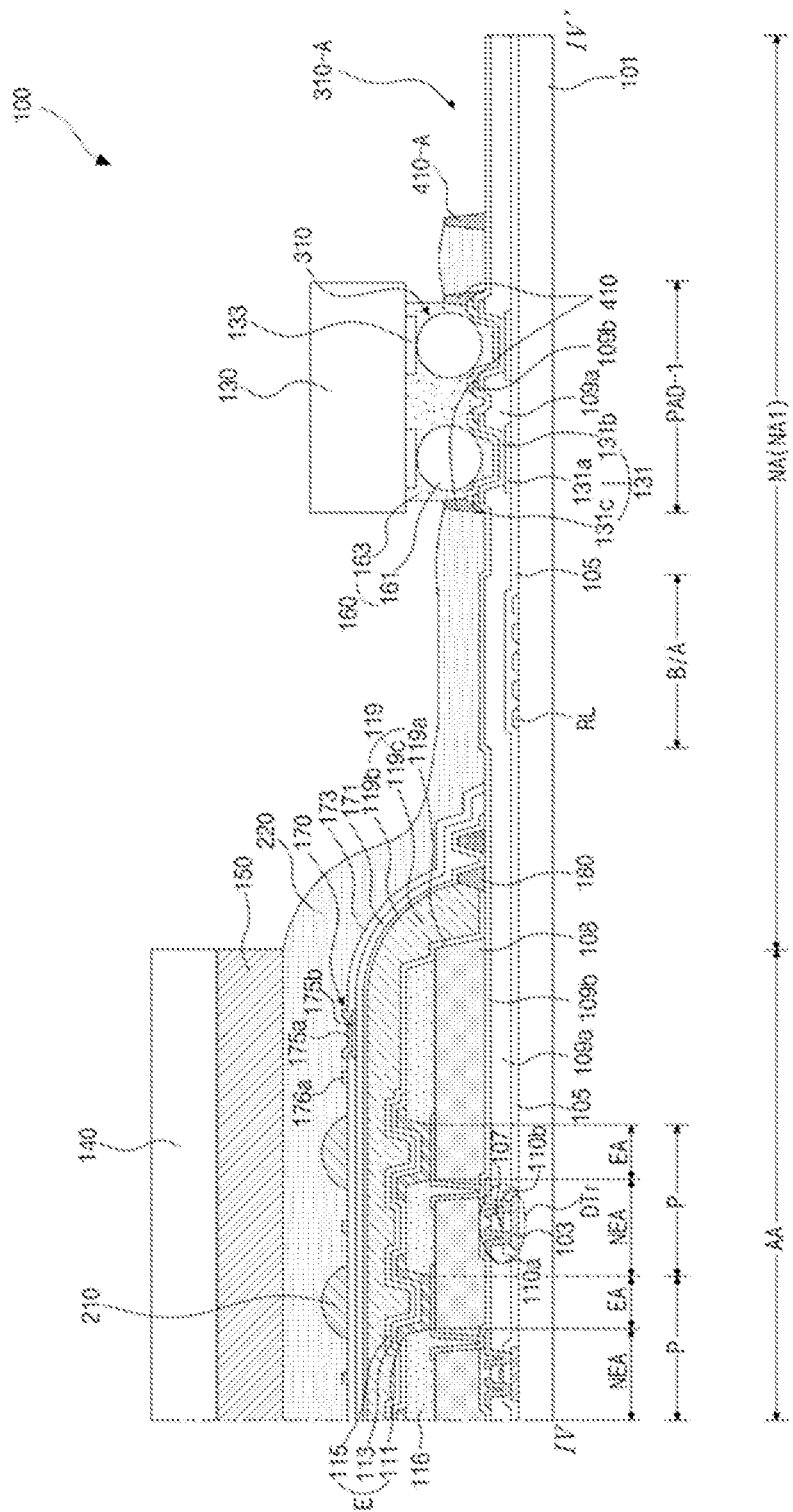
FIG. 4 is a cross-sectional view showing a first pad area of an organic light emitting diode display device according to a first aspect of the present disclosure.

FIG. 4 is a cross-sectional view showing a first pad area of an organic light emitting diode display device according to a first aspect of the present disclosure. FIG. 4 is taken along a ling IV-IV' of FIG. 3.

In FIG. 4, the driving TFT DTr is disposed in the switching area TrA of the active area AA and includes the semiconductor layer 103, the gate insulating layer and the gate electrode 107 on the semiconductor layer 103, and the source electrode 110a and the drain electrode 110b connected to the source region and the drain region, respectively, of the semiconductor layer 103.

The first electrode 111 of an anode of the light emitting diode E is disposed on the planarizing layer 108 in the emission area EA of the active area AA and is connected to the drain electrode 110b of the driving TFT DTr through the drain contact hole in the second interlayer insulating layer 109b and the planarizing layer 108.

The first electrode 111 is divided in each pixel region P with the bank 116 as a boundary of each pixel region P.

The light emitting layer 113 and the second electrode 115 of a cathode are sequentially disposed on the first electrode 111.

The sealing layer 119 of a thin film is disposed on the driving TFT DTr and the light emitting diode E. The sealing layer 119 has a structure where the organic sealing layers 119c and the inorganic sealing layers 119a and 119b are alternately repeated and extends from the active area AA to the non-active area NA.

The protecting dam 180 is disposed outside the sealing layer 119 to completely surround the active area AA.

The touch buffer layer 171 is disposed on the sealing layer 119, and the touch pattern 170 is disposed over the touch buffer layer 171. The touch pattern 170 includes the plurality of touch transmitting lines Tx (of FIG. 2) and the plurality of touch receiving lines Rx (of FIG. 2) crossing each other in the active area AA.

The touch insulating layer 173 is disposed under the plurality of touch transmitting lines Tx and the plurality of touch receiving lines Rx.

The plurality of touch transmitting lines Tx includes the plurality of first touch electrodes 175a (of FIG. 2) and the plurality of first touch bridges 175b (of FIG. 2) electrically connecting the plurality of first touch electrodes 175a. The plurality of touch receiving lines Rx include the plurality of second touch electrodes 176a (of FIG. 2) and the plurality of second bridges 176b (of FIG. 2) electrically connecting the plurality of second touch electrodes 176a.

The at least one lens pattern 210 for improving a collection efficiency and an emission efficiency of a light from the light emitting diode E is further disposed on the touch insulating layer 173. The at least one lens pattern 210 may be disposed to correspond to the emission area EA.

The passivation layer 220 is disposed on the at least one lens pattern 210 to cover the at least one lens pattern 210 of the light emitting diode E. Since the passivation layer 220 is formed to have a refractive index smaller than a refractive index of the at least one lens pattern 210, a light collection efficiency and a light emission efficiency increase due to a refractive index difference at an interface of the at least one lens pattern 210 and the passivation layer 220.

In the OLED display device 100 according to a first aspect of the present disclosure, the first dam 410 is disposed on the substrate 101 along the boundary of the first pad area PAD-1, and the boundary dam 410-A is disposed on the substrate 101 along the boundary area NA1-B.

The first non-active area NA1 outside the active area AA has the bending area B/A where the substrate 101 is bent and the first pad area PAD-1 where the plurality of first pads 131 are disposed. The bending area B/A has the plurality of connection lines RL, and various electric signals transmitted through the plurality of first pads 131 are transmitted to the driving TFT DTr in the active area AA through the plurality of connection lines RL.

The plurality of first pads 131 of the first pad area PAD-1 may be disposed in the first non-active area NA1 to transmit the data signal generated in the data driving part 130 to the data line DL (of FIG. 3) of the active area AA. The data driving part 130 has a plurality of bump electrodes 133 for transmitting the data signal generated in the data driving part 130 to the plurality of first pads 131.

The plurality of bump electrodes 133 may be disposed on and protrude from a bottom surface of the data driving part 130.

The data driving part 130 is attached to the substrate 101 having the plurality of first pads 131 by an adhesive layer 163 of an adhesive 160.

For example, the adhesive 160 may include an anisotropic conductive film. The adhesive 160 may include the adhesive layer 163 and a conductive ball 161 in the adhesive layer 163. The bump electrode 133 of the data driving part 130 and each of the plurality of first pads 131 on the substrate 101 are electrically connected to each other through the conductive ball 161 of the adhesive 160.

Each of the plurality of first pads 131 may include a first electrode layer 131a, a second electrode layer 131b and a third electrode layer 131c sequentially on the substrate 101. The first electrode layer 131a may include the same metallic material as the gate electrode 107 of the active area AA. The second electrode layer 131b may include the same metallic material as the source electrode 110a and the drain electrode 110b of the active area AA. The third electrode layer 113c may include the same material as the plurality of first touch electrodes 175a and the plurality of second touch electrodes 176a. The first electrode layer 131a may be disposed between the gate insulating layer 105 and the first interlayer insulating layer 109a, the second electrode layer 131b may be disposed between the first interlayer insulating layer 109a and the second interlayer insulating layer 109b, and the third electrode layer 131c may be disposed on the second interlayer insulating layer 109b.

As a result, the OLED display device 100 may have a chip on film (COF) type or a chip on plastic (COP) type by attaching the data driving part 130 to the plurality of first pads 131 on the substrate 101.

The first dam 410 surrounds the boundary of the first pad area PAD-1 to expose the plurality of first pads 131 of the first pad area PAD-1, and the boundary dam 410-A surrounds the boundary area NA1-B of the first non-active area NA1. The boundary dam 410-A may be disposed between the boundary area NA1-B and the first pad area PAD-1 and between the boundary area NA1-B and a portion of the bending area B/A.

As a result, while the passivation layer 220 is coated from the active area AA to the non-active area NA1, the passivation layer 220 is disposed in the non-active area NA except for the first pad area PAD-1 surrounded by the first dam 410 and the boundary area NA1-B surrounded by the boundary dam 410-A.

Since the passivation layer 220 includes a material having a relatively high flowability and a relatively low viscosity, the passivation layer 220 may be formed through a soluble method such as an inkjet printing method. For example, the passivation layer 220 may be formed through a coating step through an inkjet method, a curing step using an ultraviolet (UV) ray and a post-baking step.

The first dam 410 and the boundary dam 410-A block a flow of the material for the passivation layer 220. The first dam 410 is disposed between the active area AA and the first pad area PAD-1 and blocks a flow of the material for the passivation layer 220 such that the passivation layer 220 does not invade the first pad area PAD-1.

The boundary dam 410-A is disposed between the first pad area PAD-1 and the boundary area NA1-B and between the bending area B/A and the boundary area NA1-B and blocks a flow of the material for the passivation layer 220 such that the passivation layer 220 does not invade the boundary area NA1-B.

Since conductive lines are not disposed in the boundary area NA1-B, the passivation layer 220 is not required in the boundary area NA1-B, and a flow of the material for the passivation layer 220 to the boundary area NA1-B is blocked. As a result, an amount of the material for the passivation layer 220 decreases and a material cost for the passivation layer 220 is reduced.

Figure 5:
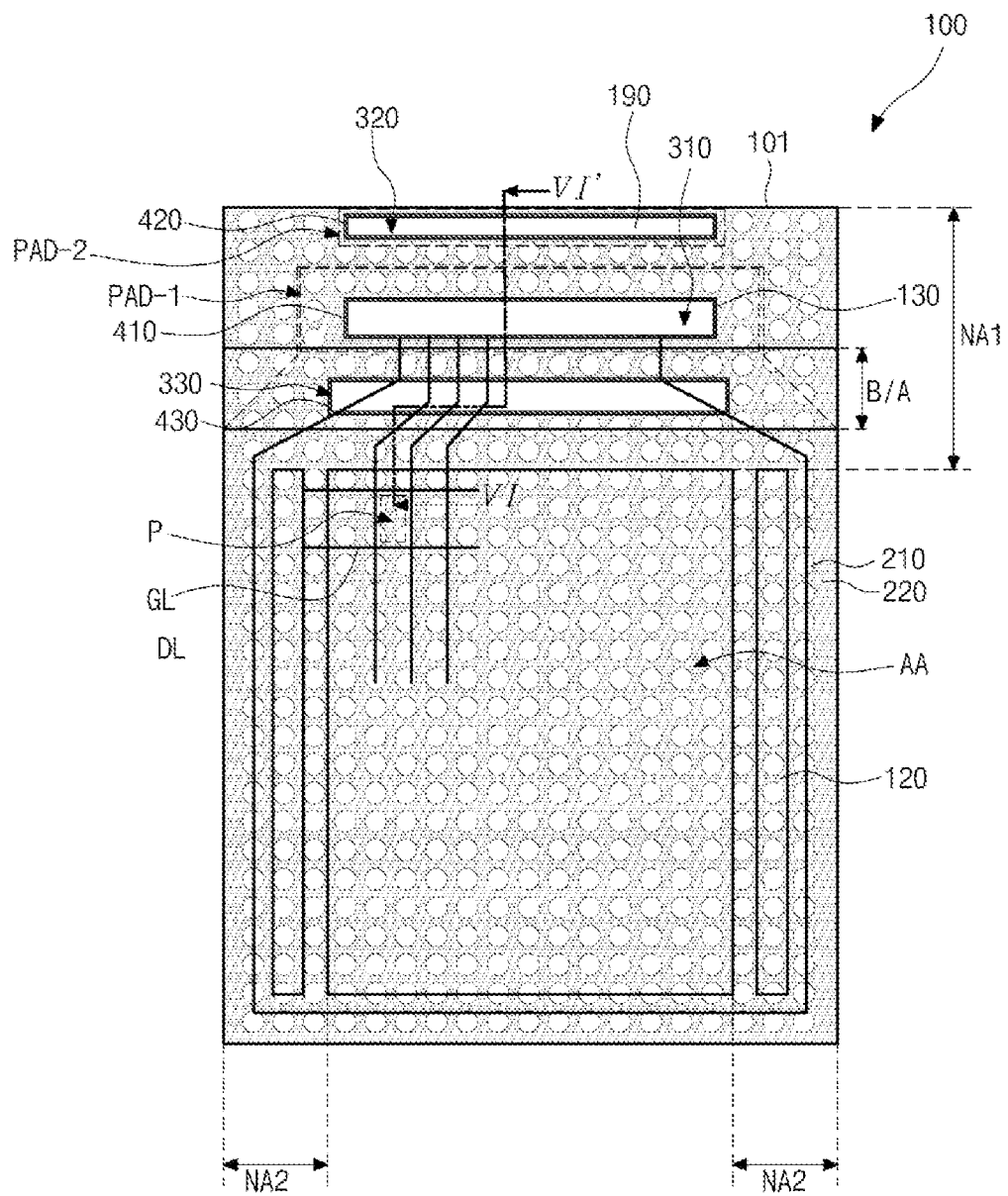
FIG. 5 is a plan view showing an organic light emitting diode display device according to a second aspect of the present disclosure.

FIG. 5 is a plan view showing an organic light emitting diode display device according to a second aspect of the present disclosure.

A part of the second aspect the same as a part of the first aspect has the same reference number, and a specific part of the second aspect will be illustrated.

In FIG. 5, a plurality of gate lines GL and a plurality of data lines DL are disposed in an active area AA. The plurality of gate lines GL and the plurality of data lines DL cross each other to define a plurality of pixel regions P. A light emitting diode E (of FIG. 1) and a driving TFT DTr (of FIG. 1) connected to each other are disposed in each pixel region P. The driving TFT DTr operates with reference to driving parts 120 and 130 in first and second non-active areas NA1 and NA2 and adjusts a driving current supplied to the light emitting diode E.

A plurality of first touch electrodes 175a and a plurality of second touch electrodes 176a are disposed in the active area AA and are connected to a second pad area PAD-2 through a routing line 177 in a second non-active area NA2 outside the active area AA.

A data driving part 130 supplying a data signal to the driving TFT DTr is disposed in a first non-active area NA1 an upper portion of the active area AA and is directly mounted on a substrate 101 as an integrated circuit (IC).

A first pad area PAD-1 for electric connection with the data driving part 130 is disposed in the first non-active area NA1 of the first non-active area NA1.

A second pad area PAD-2 for electric connection with a printed circuit board (PCB) through a flexible film 190 is disposed in a boundary portion of the first non-active area NA1.

A power part and a timing controlling part may be mounted on the PCB.

A plurality of connection lines RL connecting the first and second pad areas PAD-1 and PAD-2 and the active area AA are disposed in the first non-active area NA1 on the substrate 101. The plurality of connection lines RL transmit various electric signals from the first and second pad areas PAD-1 and PAD-2 to the driving TFT DTr in the active area AA.

A ground line GND is disposed to surround the active area AA. Specifically, the ground line GND may be disposed to surround the gate driving part 120.

The ground line GND is connected to the second pad area PAD-2 and a ground voltage applied from an exterior is supplied to the ground line GND.

To minimize a bezel, the first non-active area NA1 having the first and second pad areas PAD-1 and PAD-2 is bent to be disposed under the active area AA. As a result, when the OLED display device 100 is viewed at front thereof, the active area AA and the second non-active area NA2 are recognized, and the first non-active area NA1 is not recognized.

A bending area B/A may be defined between the active area AA and the first and second pad areas PAD-1 and PAD-2.

A passivation layer 220 on a whole of the substrate 101 includes first and second pad open portions 310 and 320 exposing the first and second pad areas PAD-1 and PAD-2, respectively.

The passivation layer 220 further includes a third open portion 330 exposing a portion of the bending area B/A.

The passivation layer 220 has the first open portion 310 exposing the first pad area PAD-1 contacting the data driving part 130 and the second open portion 320 exposing the second pad area PAD-2 contacting the flexible film 190 for the PCB.

As a result, a delamination process for exposing the plurality of first pads 131 in the first pad area PAD-1 and a plurality of second pads 191 in the second pad area PAD-2 is omitted, and reduction of a fabrication yield due to the delamination process is prevented.

Since the passivation layer 220 further includes the third open portion 330 exposing the portion of the bending area B/A, the bending area B/A may be easily bent due to the third open portion 330.

Figure 6:
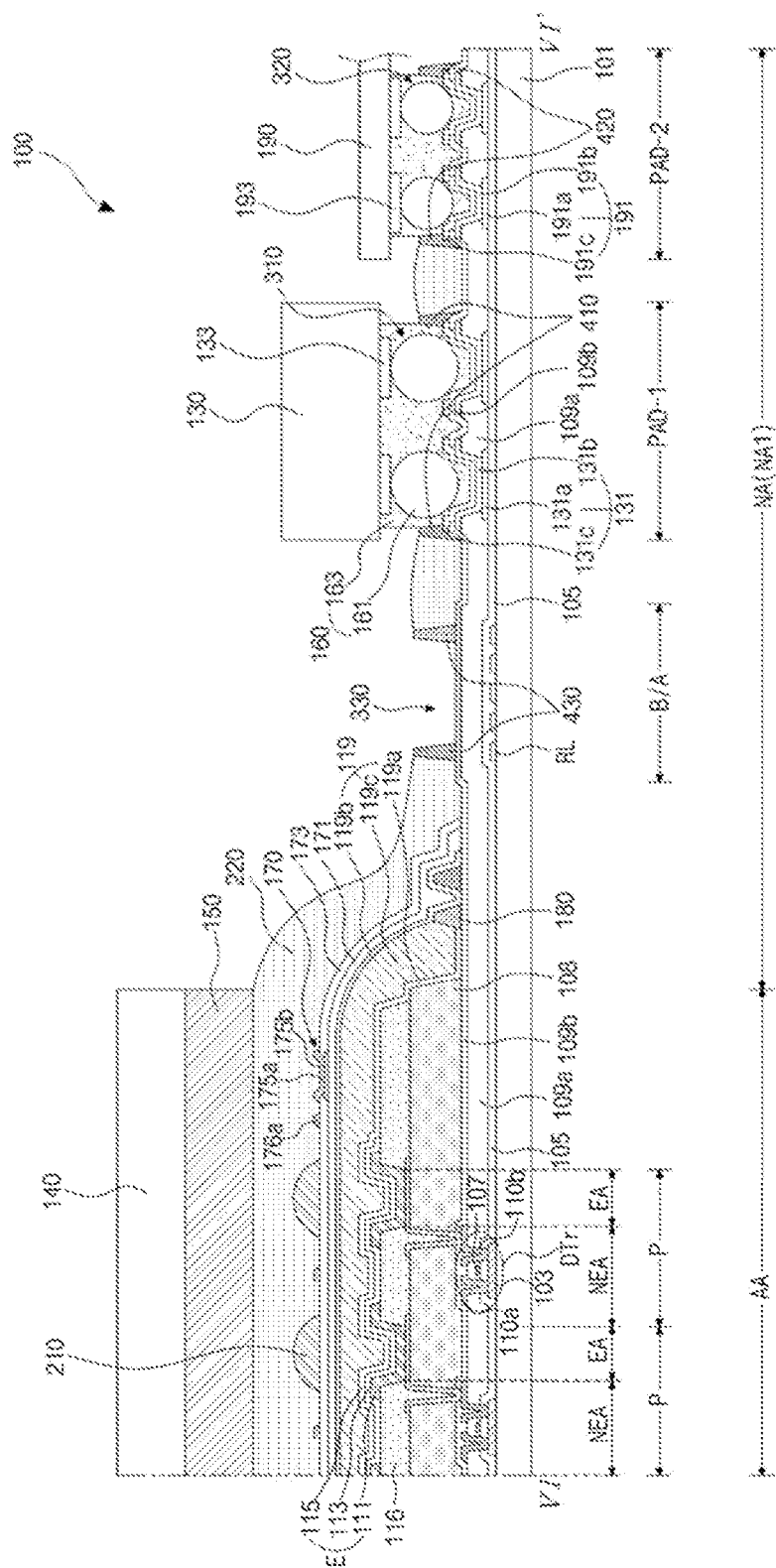
FIG. 6 is a cross-sectional view showing first and second pad areas of an organic light emitting diode display device according to a second aspect of the present disclosure.

FIG. 6 is a cross-sectional view showing first and second pad areas of an organic light emitting diode display device according to a second aspect of the present disclosure. FIG. 6 is taken along a ling VI-VI' of FIG. 5.

In FIG. 6, the driving TFT DTr is disposed in the switching area TrA of the active area AA and includes the semiconductor layer 103, the gate insulating layer and the gate electrode 107 on the semiconductor layer 103, and the source electrode 110a and the drain electrode 110b connected to the source region and the drain region, respectively, of the semiconductor layer 103.

The first electrode 111 of an anode of the light emitting diode E is disposed on the planarizing layer 108 in the emission area EA of the active area AA and is connected to the drain electrode 110b of the driving TFT DTr through the drain contact hole in the second interlayer insulating layer 109b and the planarizing layer 108.

The first electrode 111 is divided in each pixel region P with the bank 116 as a boundary of each pixel region P.

The light emitting layer 113 and the second electrode 115 of a cathode are sequentially disposed on the first electrode 111.

The sealing layer 119 of a thin film is disposed on the driving TFT DTr and the light emitting diode E. The sealing layer 119 has a structure where the organic sealing layers 119c and the inorganic sealing layers 119a and 119b are alternately repeated and extends from the active area AA to the non-active area NA.

The protecting dam 180 is disposed outside the sealing layer 119 to completely surround the active area AA.

The touch buffer layer 171 is disposed on the sealing layer 119, and the touch pattern 170 is disposed over the touch buffer layer 171. The touch pattern 170 includes the plurality of touch transmitting lines Tx (of FIG. 2) and the plurality of touch receiving lines Rx (of FIG. 2) crossing each other in the active area AA.

The touch insulating layer 173 is disposed under the plurality of touch transmitting lines Tx and the plurality of touch receiving lines Rx.

The plurality of touch transmitting lines Tx includes the plurality of first touch electrodes 175a (of FIG. 5) and the plurality of first touch bridges 175b (of FIG. 2) electrically connecting the plurality of first touch electrodes 175a. The plurality of touch receiving lines Rx include the plurality of second touch electrodes 176a (of FIG. 5) and the plurality of second bridges 176b (of FIG. 2) electrically connecting the plurality of second touch electrodes 176a.

The plurality of first touch electrodes 175a and the plurality of second touch electrodes 176a are electrically connected to the plurality of second pads 191 through the routing line 177 (of FIG. 5) in the non-active area NA outside the active area AA. As a result, the plurality of first touch electrodes 175a and the plurality of second touch electrodes 176a are connected to a touch driving part (not shown).

An at least one lens pattern 210 for improving a collection efficiency and an emission efficiency of a light from the light emitting diode E is further disposed on the touch insulating layer 173. The at least one lens pattern 210 may be disposed to correspond to the emission area EA.

The passivation layer 220 is disposed on the at least one lens pattern 210 to cover the at least one lens pattern 210 over the light emitting diode E. Since the passivation layer 220 is formed to have a refractive index smaller than a refractive index of the at least one lens pattern 210, a light collection efficiency and a light emission efficiency increase due to a refractive index difference at an interface of the at least one lens pattern 210 and the passivation layer 220.

In the OLED display device 100 according to a second aspect of the present disclosure, a first dam 410 is disposed on the substrate 101 along the boundary of the first pad area PAD-1, and a second dam 420 is disposed on the substrate 101 along the boundary of the second pad area PAD-2.

Further, a third dam 430 exposing a portion of the bending area B/A is disposed on the substrate 101 in the bending area B/A.

The first non-active area NA1 outside the active area AA has the bending area B/A where the substrate 101 is bent, the first pad area PAD-1 where the plurality of first pads 131 are disposed and the second pad area PAD-2 where the plurality of second pads 191 are disposed. The bending area B/A has the plurality of connection lines RL, and various electric signals transmitted through the plurality of first pads 131 and the plurality of second pads 191 are transmitted to the driving TFT DTr in the active area AA through the plurality of connection lines RL.

The plurality of first pads 131 of the first pad area PAD-1 may be connected to the plurality of connection lines RL extending from the bending area B/A, and the plurality of second pads 191 of the second pad area PAD-2 may be connected to an external circuit such as the PCB.

The plurality of first pads 131 of the first pad area PAD-1 may electrically contact a plurality of bump electrodes 133 of the data driving part 130 through a conductive ball 161.

The plurality of second pads 191 of the second pad area PAD-2 may be connected to the external circuit such as the PCB and may receive various signals from the external circuit such as the PCB. A plurality of bump terminals 193 of the flexible film 190 may be connected to the plurality of second pads 191 through an adhesive 160.

For example, the adhesive 160 may include an anisotropic conductive film. The adhesive 160 may include an adhesive layer 163 and a conductive ball 161 in the adhesive layer 163. The plurality of bump terminals 193 of the flexible film 190 may be connected to the plurality of second pads 191 through an adhesive 160.

The plurality of second pads 191 may include first, second and third electrode layers 191a, 191b and 191c sequentially on the substrate 101.

The first dam 410 surrounds the boundary of the first pad area PAD-1 to expose the plurality of first pads 131 of the first pad area PAD-1, and the second dam 420 surrounds the boundary of the second pad area PAD-2 to expose the plurality of second pads 191 of the second pad area PAD-2.

The third dam 430 is disposed to expose a portion of the bending area B/A. As a result, while the passivation layer 220 is coated from the active area AA to the non-active area NA1, the passivation layer 220 is disposed in the non-active area NA except for the portion of the bending area B/A surrounded by the third dam 430, the first pad area PAD-1 surrounded by the first dam 410 and the second pad area PAD-2 surrounded by the second dam 420.

Since the passivation layer 220 includes a material having a relatively high flowability and a relatively low viscosity, the passivation layer 220 may be formed through a soluble method such as an inkjet printing method. For example, the passivation layer 220 may be formed through a coating step through an inkjet method, a curing step using an ultraviolet (UV) ray and a post-baking step.

The third dam 430 is disposed between the active area AA and the bending area B/A to block a flow of the material for the passivation layer 220 toward the bending area B/A. The first dam 410 is disposed between the bending area B/A and the first pad area PAD-1 to block a flow of the material for the passivation layer 220 such that the passivation layer 220 does not invade the first pad area PAD-1.

The second dam 420 is disposed between the first and second pad areas PAD-1 and PAD-2 to block a flow of the material for the passivation layer 220 such that the passivation layer 220 does not invade the second pad area PAD-2.

Consequently, in the OLED display device 100 according to the first and second aspects of the present disclosure, since the at least one lens pattern 210 is further disposed over the sealing layer 119, the light collection efficiency and the light emission efficiency of the light emitting diode E are improved.

Since the light extraction efficiency of the OLED display device 100 is improved, the luminance efficiency of the OLED display device 100 is improved.

Specifically, the passivation layer 220 for protecting the at least one lens pattern 210 and preventing corrosion of the touch transmitting line Tx and the touch receiving line Rx of the touch pattern 170 due to the oxygen and the moisture is disposed in the active area AA and extends to the non-active area NA. The passivation layer 220 includes the first, second and third open portions 310, 320 and 330 exposing the first pad area PAD-1, the second pad area PAD-2 and the bending area B/A.

Accordingly, the delamination process of exposing the first and second pads 131 and 191 is omitted, and reduction of a fabrication yield due to the delamination process is prevented.

Further, the bending area B/A may be easily bent due to the third open portion 330.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting diode display device, comprising:
    a substrate having an active area and a non-active area;
    a light emitting diode disposed in the active area;
    a sealing layer disposed over the light emitting diode;
    at least one lens pattern disposed over the sealing layer and having a convex shape; and
    a passivation layer disposed in the active area and the non-active area,
    wherein the passivation layer covers the at least one lens pattern and has a first open portion exposing a first pad area.

2. The device of claim 1, further comprising a first dam surrounding the first pad area and disposed on the substrate.

3. The device of claim 2, further comprising a data driving part disposed in the first pad area.

4. The device of claim 3, further comprising a second pad area disposed at a side of the first pad area.

5. The device of claim 4, further comprising an external driving circuit connected to the second pad area,
    wherein the passivation layer has a second open portion exposing the second pad area.

6. The device of claim 5, further comprising a second dam surrounding the second pad area is disposed on the substrate.

7. The device of claim 1, wherein the non-active area has a bending area that is disposed between the active area and the first pad area, and wherein the passivation layer has a third open portion exposing a portion of the bending area.

8. The device of claim 7, further comprising a third dam surrounding the portion of the bending area and disposed on the substrate.

9. The device of claim 1, wherein the non-active area has a boundary area that is disposed between the first pad area and an end portion of the non-active area.

10. The device of claim 9, further comprising a boundary dam surrounding the boundary area and disposed on the substrate, wherein the passivation layer has a boundary open portion exposing the boundary area.

11. The device of claim 1, wherein the passivation layer includes epoxy resin or acrylic resin having a hydroxy group (—OH) or a fluorine group (—F) added to a substituent group, or epoxy resin or acrylic resin having nano hollow silica.

12. The device of claim 1, wherein the passivation layer has a refractive index smaller than a refractive index of the at least one lens pattern.

13. The device of claim 1, wherein the light emitting diode has an emission area corresponding to the at least one lens pattern.

14. The device of claim 1, further comprising a touch pattern of a mesh shape having an opening disposed over the sealing layer, wherein the at least one lens pattern is disposed to correspond to the opening of the touch pattern.

15. An organic light emitting diode display device, comprising:

a substrate having an active area and a non-active area;

a light emitting diode disposed in the active area;

a sealing layer disposed over the light emitting diode;

at least one lens pattern disposed over the sealing layer and having a convex shape; and a passivation layer covering the at least one lens pattern a first dam surrounding a first pad area and disposed on the substrate;

a data driving part disposed in the first pad area;

a second pad area disposed at a side of the first pad area;

an external driving circuit connected to the second pad area; and a second dam surrounding the second pad area disposed on the substrate, wherein the passivation layer has a first open portion exposing the first pad area and a second open portion exposing the second pad area.

16. The device of claim 15, wherein the non-active area has a bending area that is disposed between the active area and the first pad area, and wherein the passivation layer has a third open portion exposing a portion of the bending area.

17. The device of claim 16, further comprising a third dam surrounding the portion of the bending area.

18. The device of claim 17, further comprising a boundary dam surrounding a boundary area, wherein the passivation layer has a boundary open portion exposing the boundary area.

19. The device of claim 15, wherein the passivation layer includes epoxy resin or acrylic resin having a hydroxy group (—OH) or a fluorine group (—F) added to a substituent group, or epoxy resin or acrylic resin having nano hollow silica.

20. The device of claim 19, wherein the passivation layer has a refractive index smaller than a refractive index of the at least one lens pattern.

* * * * *